United States Patent
Mandic et al.

(10) Patent No.: US 9,234,919 B2
(45) Date of Patent: Jan. 12, 2016

(54) SENSOR ASSEMBLY, SENSOR CONTROLLER AND CURRENT-MEASURING CIRCUIT

(75) Inventors: Renato Mandic, Graz (AT); Roland Plank, Gössendorf (AT); Guido Poscharnig, Stattegg (AT)

(73) Assignee: Samsung SDI Co., Ltd., Yongin-si (KR)

( * ) Notice: Subject to any disclaimer, the term of this patent is extended or adjusted under 35 U.S.C. 154(b) by 397 days.

(21) Appl. No.: 13/447,319

(22) Filed: Apr. 16, 2012

(65) Prior Publication Data

US 2012/0262151 A1  Oct. 18, 2012

Related U.S. Application Data

(60) Provisional application No. 61/475,783, filed on Apr. 15, 2011.

(30) Foreign Application Priority Data

Jan. 10, 2012  (EP) ..................................... 12150557

(51) Int. Cl.
| | | |
|---|---|---|
| G01R 13/02 | (2006.01) | |
| G01R 31/00 | (2006.01) | |
| G01R 19/00 | (2006.01) | |
| G01R 19/25 | (2006.01) | |
| G01R 1/20 | (2006.01) | |
| G01R 15/20 | (2006.01) | |

(52) U.S. Cl.
CPC ............ *G01R 19/0092* (2013.01); *G01R 19/25* (2013.01); *G01R 1/203* (2013.01); *G01R 15/20* (2013.01)

(58) Field of Classification Search
CPC ............... G01R 31/3606; G01R 33/07; G01R 19/2513; G01R 21/00; G01R 33/0035; G01R 15/20; G01R 19/0092; G01R 31/00; G01R 35/00
USPC .............. 324/113, 177, 207.2, 263, 607, 426, 324/429, 772, 503, 522, 709, 251, 202, 324/207.13, 322
See application file for complete search history.

(56) References Cited

U.S. PATENT DOCUMENTS

| | | | | |
|---|---|---|---|---|
| 3,995,210 | A | * | 11/1976 | Milkovic ....................... 323/358 |
| 6,466,025 | B1 | * | 10/2002 | Klang ............................ 324/429 |
| 6,777,944 | B2 | * | 8/2004 | Kim et al. .................... 324/426 |
| 2009/0051325 | A1 | * | 2/2009 | Chorian et al. ............... 320/136 |
| 2009/0072816 | A1 | * | 3/2009 | Schrubbe et al. ........ 324/207.25 |

(Continued)

FOREIGN PATENT DOCUMENTS

| DE | 10060490 A1 | 6/2002 |
|---|---|---|
| DE | 10240243 A1 | 3/2004 |

(Continued)

*Primary Examiner* — Arleen M Vazquez
*Assistant Examiner* — Neel Shah
(74) *Attorney, Agent, or Firm* — Christie, Parker & Hale, LLP

(57) ABSTRACT

A sensor assembly for measuring an intensity of a current includes a first sensor apparatus configured to record an intensity of the electrical current with contact, a second sensor apparatus configured to record an intensity of the electrical current, the second sensor apparatus having a common measurement range with the first sensor apparatus, and a first analog-digital converter configured to convert analog measured values into digitized measured values. The first sensor apparatus, the second sensor apparatus and the first analog-digital converter are arranged on a common circuit carrier.

16 Claims, 3 Drawing Sheets

(56) References Cited

U.S. PATENT DOCUMENTS

2009/0102652 A1* 4/2009 Diener et al. .............. 340/545.6
2010/0100345 A1* 4/2010 Katrak et al. .................. 702/65

FOREIGN PATENT DOCUMENTS

EP  DE10060490  *  6/2002  ........... G01R 31/361
FR  2883380 A1  9/2006

* cited by examiner ations No. 12150557.2 (filed
SENSOR ASSEMBLY, SENSOR CONTROLLER AND CURRENT-MEASURING CIRCUIT

CROSS-REFERENCE TO RELATED APPLICATIONS

The present application claims priority under 35 U.S.C. §119 to European Patent Application No. 12150557.2 (filed on Jan. 10, 2012), which claims priority to U.S. Provisional Patent Application No. 61/475,783 (filed on Apr. 15, 2011), which are each hereby incorporated by reference in their respective entireties.

FIELD OF THE INVENTION

The invention relates to a first sensor assembly for measuring an intensity of an electrical current flowing through a conductor. The first sensor assembly includes a first sensor apparatus which records the intensity of the electrical current with contact and a second sensor apparatus which records the intensity of the electrical current. The first sensor apparatus and the second sensor apparatus have a common measurement range. The sensor assembly also includes a first analog-digital converter which converts analog-measured values into digitized measured values.

A second aspect of the invention relates to a second sensor assembly which measures an intensity of an electrical current flowing through a conductor. The second sensor assembly includes a first sensor apparatus which records the intensity of the electrical current with contact and a second sensor apparatus which records the intensity of the electrical current. The first sensor apparatus and the second sensor apparatus have a common measurement range.

The invention also relates to a first sensor controller which controls a sensor assembly, a second sensor controller which controls a sensor assembly, and a current-measuring circuit which measures the intensity of an electrical current.

BACKGROUND OF THE INVENTION

DE 100 60 490 A1 describes a device for monitoring a vehicle electrical system, and which includes a sensor for measuring electrical current flowing in a connecting line. In order to cover an overall larger measurement range than can be recorded using an individual sensor for the purpose of measuring the current, two sensors with different measurement ranges are provided. A Hall sensor is provided for measuring currents between 10 mA and 10 A. A resistor (shunt) which is arranged in the connecting line is provided as a sensor for measuring currents between 1 A and 10 kA. The voltage drop caused by the current to be measured at the shunt is used as an auxiliary measurement variable for determining the value of the current to be measured.

SUMMARY OF THE INVENTION

An object of the invention is to provide a sensor assembly which, in comparison with known sensor assemblies, reduces production costs for a power supply system, in particular for a motor vehicle electrical system.

An object of the invention is also to provide a sensor controller and a current-measuring circuit which reduces production costs for a power supply system, in particular for a motor vehicle electrical system.

This object is achieved with a sensor assembly which measures an intensity of an electrical current flowing through a conductor, the sensor assembly including at least one of the following: a first sensor apparatus which records the intensity of the electrical current with contact and a second sensor apparatus which records the intensity of the electrical current. The first sensor apparatus and the second sensor apparatus have a common measurement range. The sensor assembly also includes a first analog-digital converter which converts analog-measured values into digitized measured values. In accordance with embodiments of the invention, the first sensor apparatus, the second sensor apparatus and the first analog-digital converter are arranged on a common circuit carrier.

This object is also achieved by a sensor assembly which measures an intensity of an electrical current flowing through a conductor, the sensor assembly including at least one of the following: a first sensor apparatus configured to record an intensity of the electrical current with contact; a second sensor apparatus configured to record an intensity of the electrical current, the second sensor apparatus having a common measurement range with the first sensor apparatus; and a first analog-digital converter configured to convert analog measured values from the first sensor apparatus into digitized measured values, wherein the first sensor apparatus, the second sensor apparatus and the first analog-digital converter are arranged on a common circuit carrier.

This object is further achieved by a current-measuring circuit including at least one of the following: a sensor assembly having a first sensor apparatus configured to measure an intensity of an electrical current, a second sensor apparatus configured to measure an intensity of the electrical current, and first analog-digital converter operatively connected to the first sensor apparatus and configured to convert the analog measured values of the first sensor apparatus into digitized measured values; and a sensor controller operatively connected to the sensor assembly and including a microcontroller configured to evaluate the measured values from the first sensor apparatus and the second sensor apparatus and control a power supply based on the measured values.

This object is still further achieved by a on-board circuit that includes at least one of the following: a current source, an electrical load configured to receive an electric current from the current source, a power supply disconnection apparatus operatively connected and provided between the current source and the electrical load, a current-measuring circuit operatively connected to the current source and the power supply disconnection apparatus, the current-measuring circuit including a sensor assembly having a first sensor apparatus configured to measure an intensity of an electrical current, a second sensor apparatus configured to measure an intensity of the electrical current, and a first analog-digital converter operatively connected to the first sensor apparatus and configured to convert the analog measured values of the first sensor apparatus into digitized measured values; and a sensor controller operatively connected to the sensor assembly and including a microcontroller configured to evaluate the measured values from the first sensor apparatus and the second sensor apparatus and one of close and open the circuit between the current source and the electrical load.

In accordance with embodiments of the invention, the first sensor assembly is developed by virtue of the fact that the first sensor apparatus, the second sensor apparatus and the first analog-digital converter are arranged on a common circuit carrier. As a result of the fact that a relative position of the first sensor apparatus and the second sensor apparatus can be exactly positioned and fixed on the same circuit carrier as early as during the production of the sensor assembly, complicated adjustment work during the installation of the sensor assembly in the target device, for example, during installation in a vehicle, can be avoided.

In accordance with embodiments of the invention, the second sensor assembly is developed by virtue of the fact that a measurement accuracy of the second sensor apparatus in the common measurement range is worse than 0.5%, in particular worse than 1% or 2%, in particular worse than 5%, very particularly preferably worse than 10%. As a result, a sensor and/or an analog-digital converter which is/are more cost-effective than the sensor and/or analog-digital converter for the first sensor apparatus can be used for the second sensor apparatus. The accuracy of the overall measurement chain for measuring the current starting from the voltage drop across the shunt is, for example, 0.5% of the measured value +/−20 mA offset. The accuracy of the overall measurement chain for measuring the current using a Hall sensor is, for example, 10% of the measured value +/−5 A offset.

The difference in the measurement accuracies can be caused by different temperature dependencies and/or different manufacturing tolerances in a rated operating range of the first sensor apparatus and the second sensor apparatus. In this case, a rated operating range can be understood as meaning that measurement range for which the first analog-digital converter provides different digital values and/or for which the digital value comparator mentioned below carries out a comparison and/or for which the second analog-digital converter mentioned below provides different digital values.

The first sensor apparatus can include a first analog-digital converter which converts analog measured values into digitized measured values. Digitization as early as at the location at which the measured values are recorded makes it possible to avoid corruption of the measured values by their transmission from the first sensor apparatus to a sensor controller.

The first sensor apparatus and the second sensor apparatus of the sensor assembly and the first analog-digital converter can be arranged on a common circuit carrier. As a result, the second sensor assembly also has an advantage that a relative position of the first sensor apparatus and the second sensor apparatus can be exactly positioned and fixed on the same circuit carrier as early as during the production of the sensor assembly, with the result that complicated adjustment work during the installation of the sensor assembly in the target device, for example, during installation in a vehicle, is avoided.

The common circuit carrier can include a circuit board with a printed circuit, a thick-film circuit and/or a thin-film circuit. As a result of these measures, proven construction techniques can be rendered usable for the sensor assembly.

The first sensor apparatus can have a power supply circuit which is electrically insulated from the power supply circuit of the second sensor apparatus. This reduces a likelihood of a malfunction of one of the two sensor apparatuses not being detected by the sensor controller only because the two sensor apparatuses electrically influence one another. If plausibility checks, for example, can be used to detect which of the first sensor apparatus and the second sensor apparatus is defective, emergency operation can be maintained with only one of the sensor apparatus if the first sensor apparatus and the second sensor apparatus do not electrically influence one another.

The first sensor apparatus can include a shunt and/or connections for a shunt, and/or the second sensor apparatus may include a shunt and/or connections for a shunt. A shunt can be used, in particular, to measure currents of high current intensity in a reliable and cost-effective manner, a voltage drop which occurs across the connecting line of the current source anyway being used as a measurement variable.

The first analog-digital converter can be part of a microcontroller of the sensor assembly. The function of a microcontroller can be continuously adapted to new requirements and new knowledge in a cost-effective and reliable manner by means of programming.

The sensor assembly can include a connection which outputs the digital representation of the measured values, which representation is generated by the first analog-digital converter. This makes it possible to evaluate the digital output values generated by the first analog-digital converter at a location at which the measured values are required and at which spatial and environmental conditions are more suitable for evaluation electronics than at the location at which the measured values are recorded.

The second sensor apparatus can include a current sensor which is not a shunt, in particular, a current sensor which records the intensity of the electrical current in a contact-free manner. Preferably, the current sensor particularly comprises a magnetic field sensor, very particularly preferably a Hall sensor or another sensor with a magneto-resistive effect. Using physically different current intensity recording techniques makes it possible to detect principle-related or system-related faults with a greater degree of probability than when using matching current intensity recording concepts.

The sensor assembly can include a connection which outputs the measured values which can be recorded by the second sensor apparatus in an analog form. As a result, the measured values from the second sensor apparatus can be digitized and/or compared with the measured values from the first sensor apparatus at a location at which spatial and environmental conditions are more suitable for evaluation electronics than in the region of the first sensor apparatus and the second sensor apparatus. In this case, the sensor assembly does not need to have an analog-digital converter for the second sensor apparatus.

In accordance with embodiments of the invention, the sensor controller is developed by virtue of the fact that it includes a digital value comparator which digitally compares the measured values which are recorded by the first sensor apparatus and the second sensor apparatus. The sensor controller includes a second analog-digital converter which converts the analog measured values recorded by the second sensor apparatus into digitized measured values. This makes it possible to digitally compare the measured values recorded by the first sensor apparatus and the second sensor apparatus with one another.

Alternatively or additionally, the sensor controller can be developed by virtue of the fact that it includes an analog value comparator for a analog comparison of the measured values which are recorded by the first sensor apparatus and the second sensor apparatus. The sensor controller includes a digital/analog converter which converts the digitized measured values recorded by the first sensor apparatus into analog measured values. This makes it possible to compare the measured values recorded by the first sensor apparatus and the second sensor apparatus in an analog form. If the comparison of the measured values recorded by the first sensor apparatus and the second sensor apparatus is used only for fault detection or only for a rough plausibility check, it need not be a disadvantage if the comparison is carried out only in an analog form. An analog comparison may require less electrical energy than a digital comparison, The current-measuring circuit is developed by virtue of the fact that the current-measuring circuit includes a sensor assembly and a sensor controller in accordance with embodiments of the invention. As a result, advantages of the sensor assembly and the sensor controller in accordance with embodiments of the invention are used for the current-measuring circuit.

A screened line may be arranged between the second sensor apparatus and the analog value comparator and/or between the second sensor apparatus and the second analog-digital converter in order to transmit analog measured values from the second sensor apparatus.

BRIEF DESCRIPTION OF THE DRAWINGS

Advantageous refinements of the invention will emerge from the dependent claims. An exemplary embodiment of the invention will be discussed in principle below on the basis of the drawing, in which:

DETAILED DESCRIPTION OF EMBODIMENTS

In the figures, the same reference symbols are used for corresponding components in each case. Explanations based on reference symbols therefore apply throughout the figures, unless the context indicates otherwise.

Figure 1:
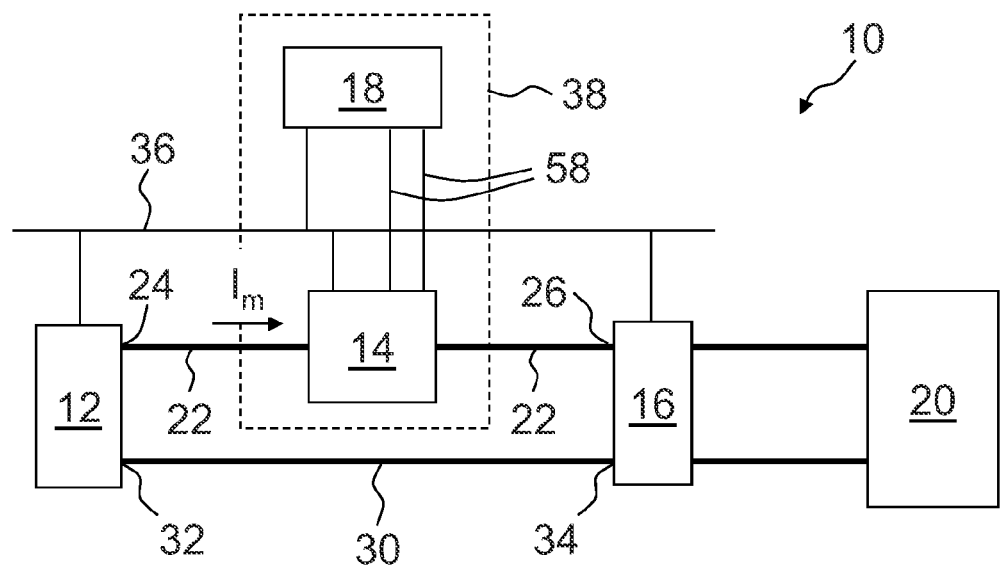
FIG. 1 illustrates a schematic block diagram of an on-board circuit of a motor vehicle.

As illustrated in FIG. 1 the on-board circuit 10 of a vehicle, in particular a motor vehicle, includes a current source 12 (for example, a battery, in particular, a rechargeable battery and/or a vehicle battery), a sensor assembly 14, a power supply disconnection apparatus 16, a sensor controller 18 and an electrical load 20. The electrical load 20 may comprise a plurality of electrical energy loads (for example, starters, motor electronics, lighting system, assistance system, etc.). The power supply disconnection apparatus 16 is inserted in a bipolar manner into the circuit 10 between the current source 12 and the electrical load 20.

The sensor assembly 14 is arranged in the positive line 22 between the positive connection 24 of the current source 12 and the positive connection 26 of the power supply disconnection apparatus 16. Alternatively, the sensor assembly 14 may be arranged in the negative line 30 between the negative connection 32 of the current source 12 and the negative connection 34 of the power supply disconnection apparatus 16, The sensor controller 18 (for example, provided in a power supply control device or in a battery control device) is connected to the current source 12, the sensor assembly 14 and the power supply disconnection apparatus 16 via a data bus 36 (for example, via a CAN bus). The sensor controller 18 can receive measurement data from the current source 12 and the sensor assembly 14 via the data bus 36. The sensor controller 18 receives, for example, instantaneous temperature-measured values from the current source 12 and instantaneous current intensity-measured values from the sensor assembly 14 via the data bus 36. On the basis of these data and/or other data, the sensor controller 18 determines whether to send a signal to the power supply disconnection apparatus 16, via the data bus 36, to open or close the circuit between the current source 12 and the electrical load 20.

Figure 2:
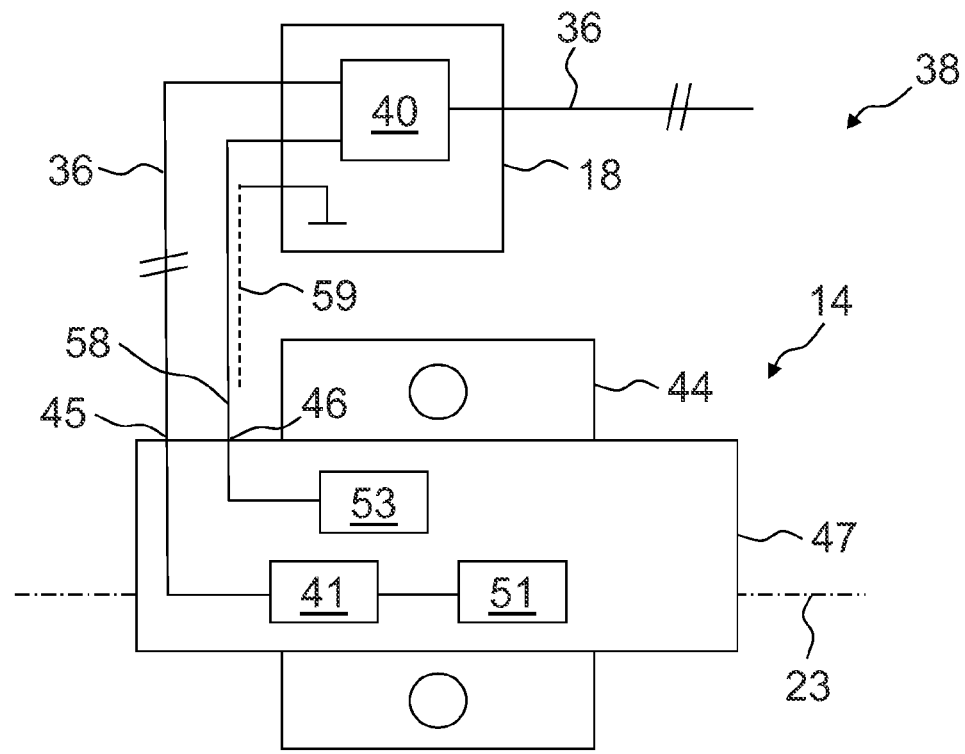
FIG. 2 illustrates a schematic block diagram of a first embodiment of a current-measuring circuit.

As illustrated in FIG. 2, the current-measuring circuit 38 of the on-board circuit 10 includes the sensor controller 18 and the sensor assembly 14. The sensor assembly 14 includes a sensor circuit board 47 and a fastening component 44. A second sensor apparatus 53 (such as, for example, a Hall sensor) and a first analog-digital converter 41 for a first sensor apparatus 51 are arranged on the sensor circuit board 47. The circuits for the first sensor apparatus 51 and for the Hall sensor 53 are preferably completely electrically separated from one another, that is to say electrically insulated, on the sensor circuit board 47. The measured values recorded and digitized by the first sensor apparatus 51 are output via a first connection 45. The analog measured values recorded by the second sensor apparatus 53 are output via a second connection 46. The fastening component 44 makes it possible to arrange the sensor assembly 14 in the region of the positive line 22 with sufficiently accurate positioning for the second sensor apparatus 53 (based on a longitudinal axis 23 of the positive line 22).

A microcontroller 40 is arranged in the sensor controller 18 for the purpose of evaluating the measurement data and for controlling the power supply disconnection apparatus 16. In accordance with embodiments, the analog-digital conversion of the measurement signal from the second sensor apparatus 53 and the comparison of the measured values from both sensor apparatuses 51, 53 can be carried out inside the microcontroller 40.

Figure 3:
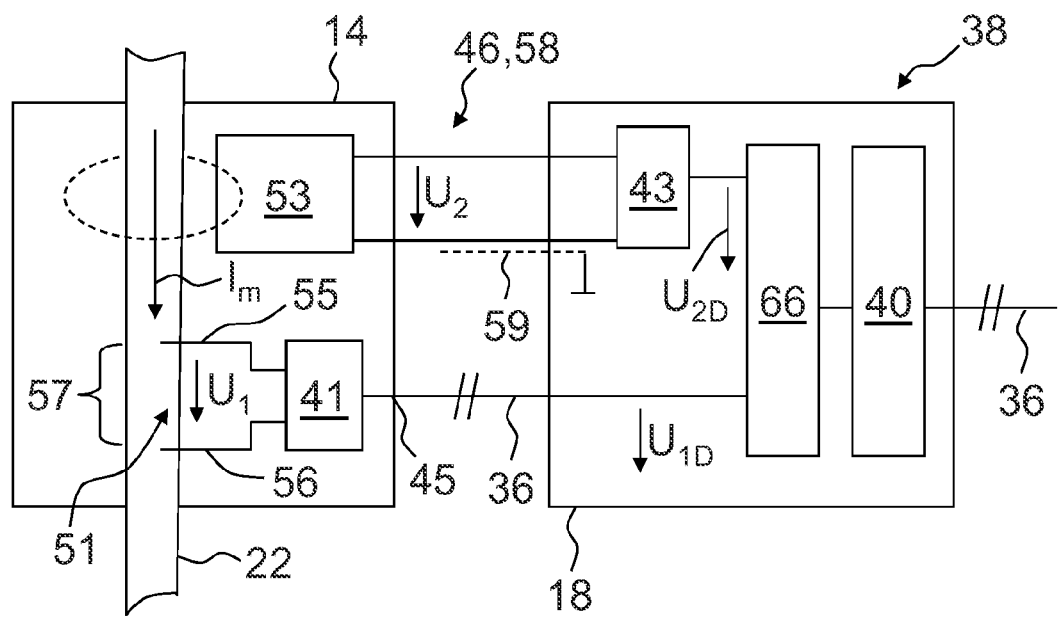
FIG. 3 illustrates a schematic block diagram of a second embodiment of a current-measuring circuit, the sensor controller having a digital value comparator.
Figure 5:
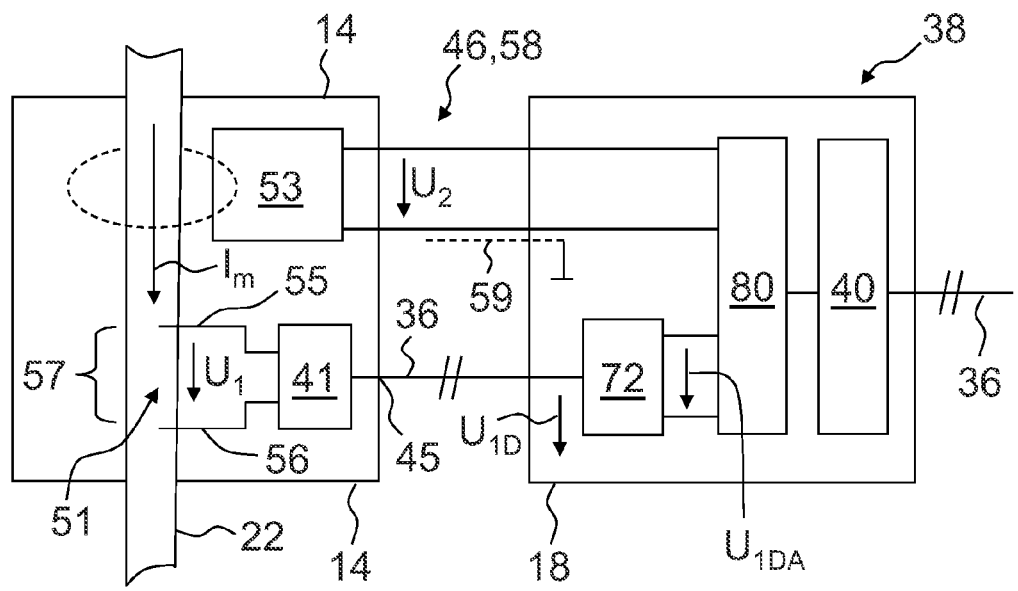
FIG. 5 illustrates a schematic block diagram of a third embodiment of the current-measuring circuit, the sensor controller having an analog value comparator.

As illustrated in FIGS. 2, 3 and 5, a connection to the data bus 36 is in each case provided on the sensor controller 18 for the purpose of transmitting the measurement data from the first sensor apparatus 51 and for transmitting commands to the power supply disconnection apparatus 16. This may be advantageous if input and output are intended to be effected using different bus systems. Alternatively, the connection for receiving the measurement data from the first sensor apparatus 51 and the connection for transmitting commands to the power supply disconnection apparatus 16 may be connected inside the sensor controller 18. Only one connection for the data bus 36 then is required for routing out of the sensor controller 18.

As illustrated in FIG. 3, in accordance with a second embodiment, a longitudinal portion 57 of the positive line 22 can be used as a shunt 50, the voltage drop $U_1$ across the shunt 50 being tapped off at two different locations of the positive line 22 using contacts 55, 56 and being supplied to the first analog-digital converter 41. Particularly if the maximum current intensity on the positive line is less than 1 A or less than 100 mA, it may be expedient to arrange the shunt 50 on the sensor circuit board 47. The first analog-digital converter 41 generates a digital signal $U_{1D}$ from the voltage drop $U_1$ across the shunt 50. For reasons of clarity, the voltage arrows are sometimes depicted without a reference potential (that is to say only schematically) in the figures. The first digital signal $U_{1D}$ is transmitted, via a data line, for example, via a data bus 36, to the sensor controller 18 and is evaluated there by the microcontroller 40.

The second sensor apparatus 53 provides an output voltage $U_2$ as an analog signal at its output 46, the output signal representing the measured value $I_m$ recorded by the Hall sensor 53. The output voltage $U_2$ is preferably provided by the second sensor apparatus 53 in a potential-free manner. This output voltage is transmitted to the microcontroller 40 by way of the analog line 58 for the purpose of evaluation.

In order to transmit the analog measured values from the second sensor apparatus 53 using the output voltage $U_2$, the analog line 58 which is screened can be arranged between the second sensor apparatus 53 and the analog value comparator 80 and/or between the second sensor apparatus 53 and the second analog-digital converter 43. This makes it possible to avoid corruption of the sensitive analog measurement signal $U_2$ from the second sensor apparatus 53 on the way from the sensor assembly 14 to the sensor controller 18. It is thus advantageous if the analog line 58 has a screen 59.

in accordance with the second embodiment illustrated in FIG. 3, (in contrast to the embodiment illustrated in FIG. 2), the comparison is carried out outside of the microcontroller 40. The second embodiment of the current-measuring circuit 38 explains a first possibility for comparing the measured value $U_2$ from the second sensor apparatus 53 with the measured value $U_1$ from the first sensor apparatus 51. For this purpose, a second analog-digital converter 43 and a digital value comparator 66 are arranged in the current-measuring circuit 38. The analog measurement signal $U_2$ from the second sensor apparatus 53 is supplied to the second analog-digital converter 43. The digital signal $U_{1D}$ from the first analog-digital converter 41 and the digital signal $U_{2D}$ from the second analog-digital converter 43 are supplied to the digital value comparator 66.

Figure 4:
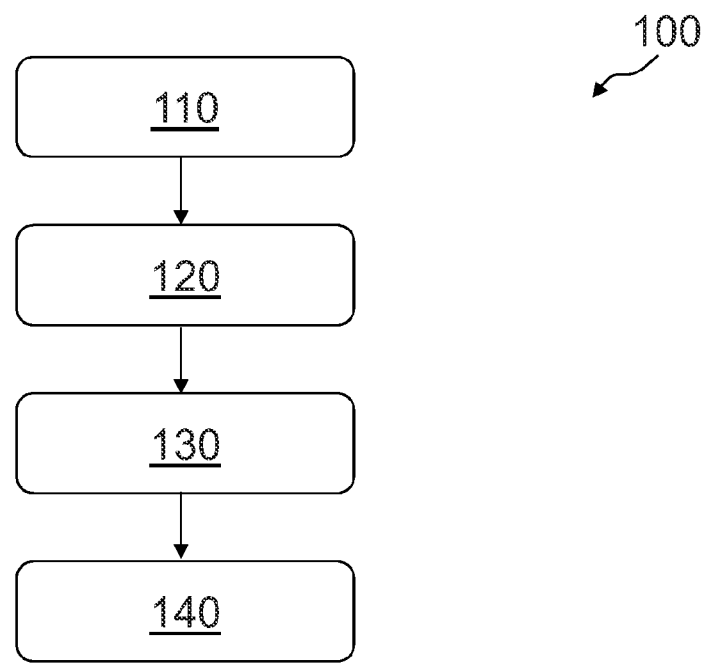
FIG. 4 illustrates a schematic flowchart for the digital value comparison of the second embodiment.

As illustrated in FIG. 4, a flowchart illustrates steps which can be used to carry out the comparison 100 in the digital value comparator 66. In order to carry out this calculation 100, a microcontroller 40 or an ASIC can be provided. The digital value comparison can be carried out, for example, in accordance with the following equation by way of a subtraction 110, absolute value generation 120 of the two digital values $U_{1D}$, $U_{2D}$, addition 130 with an offset value $-U_{REF}$ and use of a Heaviside function $H(x)$ 140: comparison result=$H(|U_{2D}-U_{1D}|+(-U_{REF}))$.

Figure 6:
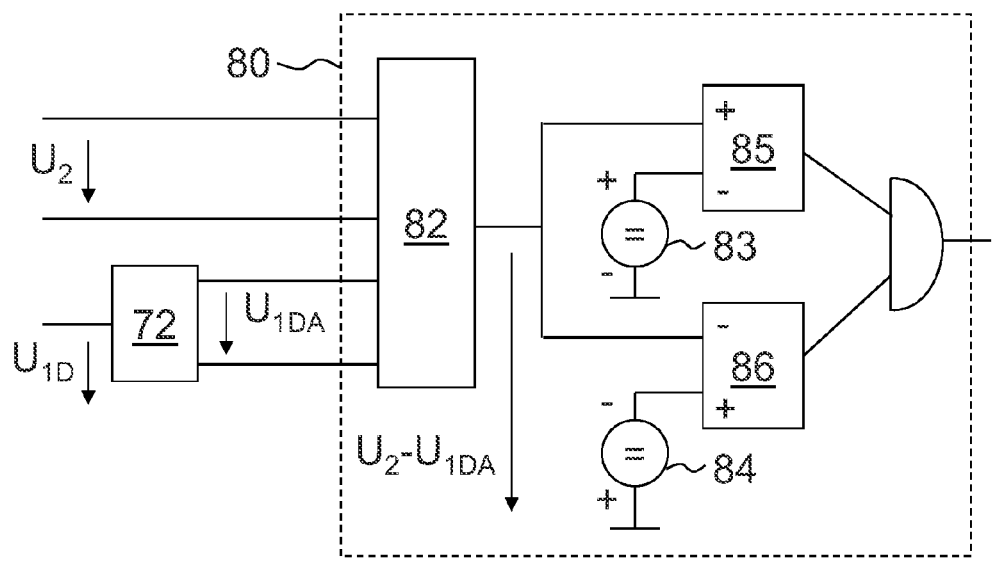
FIG. 6 illustrates a schematic block diagram of an analog value comparator for the third embodiment.

In comparison with an analog value comparator 80 illustrated in FIGS. 5 and 6, a digital value comparator 66 has the advantage of less complexity for adapting to new requirements or knowledge on account of programmability.

As illustrated in FIG. 5, in accordance with a third embodiment of the current-measuring circuit 38, provided is a second possibility for comparing the measured value $U_2$ from the second sensor apparatus 53 with the measured value $U_1$ from the first sensor apparatus Si. For this purpose, a digital/analog converter 72 and an analog value comparator 80 are arranged in the current-measuring circuit 38. The digitized measurement signal $U_{1D}$ from the first sensor apparatus 51 is supplied to the digital/analog converter 72. The analog signal $U_{1DA}$ from the digital/analog converter 72 and the analog measurement signal $U_2$ from the second sensor apparatus 53 are supplied to the analog value comparator 80. The analog line 58 used for the analog measurement signal $U_2$ preferably has a screen 59.

As illustrated in FIG. 6, the comparison 100 can be carried out in the analog value comparator 80, for example, using an operational amplifier 82 for subtraction, a pair of reference voltage sources 83, 84 and a pair of Schmitt triggers 85, 86. In comparison with a digital value comparator 66, an analog value comparator 80 has the advantage of lower power consumption. In addition, it is advantageous if only a digital/analog converter 72 is required instead of a second analog-digital converter 43. If the comparison of the measured values recorded by the two sensor apparatuses 51, 53 is used only for fault detection or for only a rough plausibility check, it need not be a disadvantage if the measured values are compared only in an analog form.

The current-measuring circuit 10 in accordance with embodiments preferably includes a sensor assembly and a sensor controller. As a result, advantages of the sensor assembly and of the sensor controller can be used for current-measuring circuits of the generic type.

The same circuit principles can also be used with the opposite polarity. Analog and/or digital electrical signals which are represented in the form of voltages in the exemplary embodiments may also be alternatively or additionally represented as (impressed) currents. Voltages or currents mentioned in the description can be resealed on the way from their respective source to their respective sink using amplifiers or converters. Analog or digital signals which are represented in the form of voltages or currents may be coded in a linear or non-linear manner in accordance with a known method or according to a method which is not yet known. Examples of coding methods which can be used are pulse width modulation and pulse code modulation. The analog and/or digital signals may be transmitted electrically, optically or by radio. The analog and/or digital signals may be transmitted using space division multiplexing (that is to say using different lines), using time division multiplexing or using code division multiplexing. The analog and digital signals can be transmitted using one or more bus systems.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A sensor assembly for a current-measuring circuit and operatively connected to a power supply disconnection apparatus of a motor vehicle on-board circuit, the sensor assembly comprising:
   a first sensor apparatus arranged on a common circuit carrier to measure an intensity of an electrical current and output the measurements to a sensor controller via a first connection;
   a second sensor apparatus arranged on the common circuit carrier to measure an intensity of the electrical current and output the measurements in analog form to the sensor controller via a second connection, the second sensor apparatus not including an analog-digital converter; and
   a first analog-digital converter arranged on the common circuit carrier to convert analog measured values of the first sensor apparatus to digitized measured values,
   wherein the sensor controller has a microcontroller to evaluate the measured values from the first sensor apparatus and the second sensor apparatus and thereby control a power supply based upon the evaluated measured values.

2. The sensor assembly of claim 1, wherein the common circuit carrier comprises a circuit board with at least one of a printed circuit, a thick-film circuit, or a thin-film circuit.

3. The sensor assembly of claim 1, wherein the first sensor apparatus is electrically insulated from the second sensor apparatus.

4. The sensor assembly of claim 1, wherein the second sensor apparatus is to record the intensity of the electrical current in a contact-free manner.

5. The sensor assembly of claim 4, wherein the second sensor apparatus comprises a sensor having a magneto-resistive effect.

6. A current-measuring circuit for an on-board circuit of a motor vehicle, the current-measuring circuit comprising:
- a sensor assembly arranged on a common circuit carrier and operatively connected to a power supply disconnection apparatus of the on-board circuit, the sensor assembly including:
  - a first sensor apparatus to measure an intensity of an electrical current and output the measurements to a sensor controller via a first connection;
  - a second sensor apparatus to measure an intensity of the electrical current and output the measurements in analog form to the sensor controller via a second connection, the second sensor apparatus being without an analog-digital converter; and
  - a first analog-digital converter to convert analog measured values of the first sensor apparatus to digitized measured values,
- wherein the sensor controller has a microcontroller to evaluate the measured values from the first sensor apparatus and the second sensor apparatus and thereby control the power supply disconnection apparatus based upon the evaluated measured values.

7. The current-measuring circuit of claim 6, wherein the first sensor apparatus and the second sensor apparatus are arranged on the common circuit carrier to use different current intensity measurement techniques.

8. The current-measuring circuit of claim 7, wherein the common circuit carrier comprises a circuit board with at least one of a printed circuit, a thick-film circuit, or a thin-film circuit.

9. The current-measuring circuit of claim 6, wherein the first sensor apparatus is electrically insulated from the second sensor apparatus.

10. The current-measuring circuit of claim 6, wherein the second sensor apparatus is to record the intensity of the electrical current in a contact-free manner.

11. The current-measuring circuit of claim 10, wherein the second sensor apparatus comprises a sensor having a magneto-resistive effect.

12. A current-measuring circuit for an on-board circuit of a motor vehicle, the current-measuring circuit comprising:
- a sensor assembly operatively connected to a power supply disconnection apparatus of the on-board circuit, the sensor assembly including:
  - a common circuit carrier;
  - a first sensor apparatus arranged on the common circuit carrier to measure an intensity of an electrical current and output the measurements to a sensor controller via a first connection;
  - a second sensor apparatus arranged on the common circuit carrier to measure an intensity of the electrical current and output the measurements in analog form to the sensor controller via a second connection, wherein the second sensor apparatus is arranged without an analog-digital converter; and
  - a first analog-digital converter arranged on the common circuit carrier and operatively connected to the first sensor apparatus to convert analog measured values of the first sensor apparatus to digitized measured values,
- wherein the sensor controller is operatively connected to the sensor assembly and has a microcontroller to evaluate the measured values from the first sensor apparatus and the second sensor apparatus and thereby control the power supply disconnection apparatus based upon the evaluated measured values.

13. The current-measuring circuit of claim 12, wherein the common circuit carrier comprises a circuit board with at least one of a printed circuit, a thick-film circuit, or a thin-film circuit.

14. The current-measuring circuit of claim 12, wherein the first sensor apparatus is electrically insulated from the second sensor apparatus.

15. The current-measuring circuit of claim 12, wherein the second sensor apparatus is to record the intensity of the electrical current in a contact-free manner.

16. The current-measuring circuit of claim 15, wherein the second sensor apparatus comprises a sensor having a magneto-resistive effect.

* * * * *